US012507379B2

(12) United States Patent
Liu et al.

(10) Patent No.: US 12,507,379 B2
(45) Date of Patent: Dec. 23, 2025

(54) STRUCTURE FOR EVENLY APPLYING FORCES ON A HEAT DISSIPATION BASE

(71) Applicant: ASIA VITAL COMPONENTS (CHINA) CO., LTD., Shenzhen (CN)

(72) Inventors: Xue-Hui Liu, Shenzhen (CN); Lei Li, Shenzhen (CN)

(73) Assignee: ASIA VITAL COMPONENTS (CHINA) CO., LTD., Shenzhen (CN)

(*) Notice: Subject to any disclaimer, the term of this patent is extended or adjusted under 35 U.S.C. 154(b) by 525 days.

(21) Appl. No.: 18/133,501

(22) Filed: Apr. 11, 2023

(65) Prior Publication Data
US 2023/0413490 A1 Dec. 21, 2023

(30) Foreign Application Priority Data
May 31, 2022 (TW) .................................. 111120244

(51) Int. Cl.
H05K 7/20 (2006.01)
(52) U.S. Cl.
CPC .................. H05K 7/2049 (2013.01)
(58) Field of Classification Search
CPC ...... H05K 7/2049; H05K 1/184; H05K 3/306; H01L 2023/4081; H01L 2023/4087; H01L 23/4006
USPC ..................................... 165/80.2; 361/379.01
See application file for complete search history.

(56) References Cited

U.S. PATENT DOCUMENTS

| 5,662,163 | A | * | 9/1997 | Mira | .............. H01L 23/4006 361/720 |
| 6,282,093 | B1 | * | 8/2001 | Goodwin | ............ H01L 23/4006 361/720 |
| 6,475,011 | B1 | * | 11/2002 | Sinha | .................... H05K 3/325 439/330 |

(Continued)

FOREIGN PATENT DOCUMENTS

| CN | 103596405 A |   | 2/2014 |   |
| CN | 110740573 A | * | 1/2020 | ............ H05K 1/184 |

(Continued)

OTHER PUBLICATIONS

Search Report dated Feb. 6, 2023 issued by Taiwan Intellectual Property Office for counterpart application No. 111120244.

*Primary Examiner* — Len Tran
*Assistant Examiner* — Gustavo A Hincapie Serna
(74) *Attorney, Agent, or Firm* — Demian K. Jackson; Jackson IPG PLLC

(57) ABSTRACT

A structure includes a heat dissipation base having through bores formed at four corners thereof for screw fastening elements to extend therethrough and fix the heat dissipation base to a top of a heat source, a boss upward protruded from the heat dissipation base, and a shaft extended in a radial direction through the boss with two ends projected from the boss; a hold-down member disposed on the heat dissipation base and formed with a through-opening for externally fitted around the boss; and an adjustment element having a hollow cylindrical body fitting around the boss and having a sliding slot section and a force applying section operable for the sliding slot section and the shaft to slide relative to each other and drive the hollow cylindrical body downward against the hold-down member, forcing the latter to apply evenly downward forces on a central area of the heat dissipation base.

3 Claims, 6 Drawing Sheets

(56) References Cited

U.S. PATENT DOCUMENTS

| | | | | |
|---|---|---|---|---|
| 6,724,632 | B2* | 4/2004 | Lee | H01L 23/4093 24/457 |
| 6,930,884 | B2* | 8/2005 | Cromwell | H05K 7/12 361/709 |
| 7,095,614 | B2* | 8/2006 | Goldmann | H01L 23/4006 165/185 |
| 7,249,954 | B2* | 7/2007 | Weiss | H05K 1/141 439/66 |
| 7,280,363 | B2* | 10/2007 | Reyzin | H01L 23/4338 257/E23.094 |
| 7,399,185 | B2* | 7/2008 | Colbert | H05K 3/325 257/E23.084 |
| 7,486,516 | B2* | 2/2009 | Colbert | H01L 23/4006 439/71 |
| 7,536,781 | B2* | 5/2009 | Cromwell | H05K 7/12 29/830 |
| 7,777,329 | B2* | 8/2010 | Colbert | H01L 23/4093 257/713 |
| 10,170,391 | B2* | 1/2019 | Dickover | H05K 1/0203 |
| 12,207,389 | B2* | 1/2025 | Peng | H01L 23/4006 |
| 2008/0151504 | A1* | 6/2008 | Eckberg | H01L 23/4006 361/715 |
| 2019/0120870 | A1* | 4/2019 | Cvach | B81B 7/0016 |
| 2020/0058572 | A1* | 2/2020 | Wu | H01L 23/4006 |
| 2021/0066161 | A1* | 3/2021 | Kitahama | H01L 23/4006 |
| 2022/0167526 | A1* | 5/2022 | Xu | H05K 7/20418 |
| 2022/0408588 | A1* | 12/2022 | Yeh | G06F 1/20 |
| 2023/0180419 | A1* | 6/2023 | O'Leary | H01L 23/4006 439/55 |
| 2023/0247794 | A1* | 8/2023 | Tseng | H01L 23/4006 165/104.19 |
| 2023/0371208 | A1* | 11/2023 | McKerlie | H05K 7/2049 |
| 2024/0159476 | A1* | 5/2024 | Lo | F28D 1/06 |

FOREIGN PATENT DOCUMENTS

| | | | | |
|---|---|---|---|---|
| CN | 114449821 A | * | 5/2022 | H05K 5/0204 |
| TW | M313953 U | | 6/2007 | |
| TW | M365628 U | | 9/2009 | |
| TW | M500441 U | | 5/2015 | |
| TW | I635795 B | | 9/2018 | |

* cited by examiner

STRUCTURE FOR EVENLY APPLYING FORCES ON A HEAT DISSIPATION BASE

This application claims the priority benefit of Taiwan patent application number 111120244 filed on May 31, 2022.

FIELD OF THE INVENTION

The present invention relates to a structure for evenly applying forces on a heat dissipation base, and more particularly, to a structure that enables a heat dissipation base or a heat transfer element to more evenly and fitly contact with a heat source.

BACKGROUND OF THE INVENTION

Heat transfer element and heat dissipation element are a commonly seen combination for contacting with a heat source and transferring heat from the heat source to a remote location for dissipating into ambient air. Generally, the heat transfer element includes a base having better heat conductivity, it works together with heat pipes or vapor chambers to evenly guide out or transfer the heat produced by the heat source to a remote location for dissipation. However, the heat pipes or the vapor chambers must be fixed to the base, or be fixed to the base and a fixing seat located around the heat source.

Please refer to FIGS. 1a and 1b, which show a conventional thermal module. On a conventional motherboard of an electronic device, there is at least one heat source 1. Each of the heat sources 1 has a heat sink correspondingly contacting therewith to dissipate heat produced by the heat source 1. To fix the heat sink in place corresponding to the heat source 1, a fixing seat 2 is provided around the heat source 1, and the heat sink is connected at four corners thereof to the fixing seat 2 using screw fasteners, so that the heat sink is in contact with the heat source 1 to absorb and transfer the heat produced by the heat source 1 to a remote location.

Nowadays, high performance and high power chips are used in electronic devices for them to provide highly enhanced computing power. The chip in processing data will produce a relatively high amount of heat to form a heat source 1. Conventionally, the chip is packaged or encapsulated to avoid the chip from being damaged. With the enhanced computing power thereof, the chip in processing data produces even more heat than ever before. However, the package of the chip adversely affects the produced heat from efficiently dissipating into outer environment. Further, there are also many currently available chips being provided in the form of bare dies without any package to protect their surfaces. The surface of a bare die is usually a non-smooth surface. When fixing the heat sink to a top of the bare chip, i.e. the heat source 1, the fastening strength at the fixing points should be adjusted one by one to ensure that the heat sink is in tight contact with the heat source 1 and prevent the heat source 1 in the form of bare die from breaking under excessive downward pressure from the heat sink. However, in the existing assembling manner, the heat sink is fixed to the top of the heat source 1 (bare chip) on a production line with a power driver being handled manually or via a robotic arm to tighten screw fasteners at a very quick speed, and it is impossible to sequentially tighten the screw fasteners one by one in a diagonal direction and to make necessary adjustment of the tightening strength of the screw fasteners one by one. On the production line, each of the screw fasteners is quickly and fully tightened. This tends to result in uneven distribution of forces on four corners of the heat sink, and it is impossible for the heat sink to completely flatly contact with the top of the heat source 1 and ensure whether a proper tightening strength is applied to the heat sink and the heat source 1.

In the event the screw fasteners are not sequentially fastened in the diagonal direction, it is possible only the four corners of the heat sink are tightly attached to the fixing seat 2 while a central area of the heat sink corresponding to the heat source 1 is arched and deformed when the four corners of the heat sink are downward pressed by the screw fasteners. A gap will form between the arched central area of the heat sink and the heat source 1 and a thermal resistance will occur at the location with the gap to cause unevenly heated heat sink or ineffective heat transfer of the heat sink. Meanwhile, in the event the heat sink is directly fixed to the top of the heat source 1 with an excessive downward fastening force in one time, it tends to cause breaking or damage to the bare die.

It is therefore an important goal of thermal module manufacturers to make necessary improvement for all areas of the heat sink to be in fit and tight contact with the heat source 1.

SUMMARY OF THE INVENTION

To effectively solve the problem in the conventional thermal module, a primary object of the present invention is to provide a structure for evenly applying forces on a heat dissipation base, so that the entire heat dissipation base is subjected to evenly distributed downward forces to be in fit and tight contact with a heat source.

To achieve the above and other objects, the structure for evenly applying forces on a heat dissipation base according to an embodiment of the present invention includes a heat dissipation base, an adjustment element, and a hold-down member. The heat dissipation base has an upper surface and a lower surface, and includes at least one through bores formed at each of four corners of the heat dissipation base; a screw fastening element extended through each of the through bores to fix the heat dissipation base to a top of a heat source with the lower surface of the heat dissipation base being in contact with the heat source; a boss upward protruded from the upper surface; and a shaft extended in a radial direction through the boss with two ends of the shaft projected from an outer surface of the boss. The hold-down member has an upper side and a lower side and is formed with a through-opening that extends from the upper side to the lower side. The hold-down member is disposed on the upper surface of the heat dissipation base with the through-opening correspondingly fitted around the outer surface of the boss. The adjustment element includes a hollow cylindrical body with two open ends for externally fitting around the boss. The hollow cylindrical body is provided on a peripheral wall with a sliding slot section and a force applying section. The shaft of the heat dissipation base is engaged with and slidable along the sliding slot section. The force applying section is operable to drive the hollow cylindrical body to rotate while causing the shaft of the heat dissipation base to slide in along the sliding slot section, such that the hollow cylindrical body is brought to move downward in an axial direction of the boss, enabling the adjustment element to force the hold-down member to apply evenly distributed downward forces on a center area of the heat dissipation base.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein

FIG. 1b is an assembled sectional view of FIG. 1a;

DETAILED DESCRIPTION OF THE PREFERRED EMBODIMENTS

The present invention will now be described with a preferred embodiment thereof.

Figure 1A:
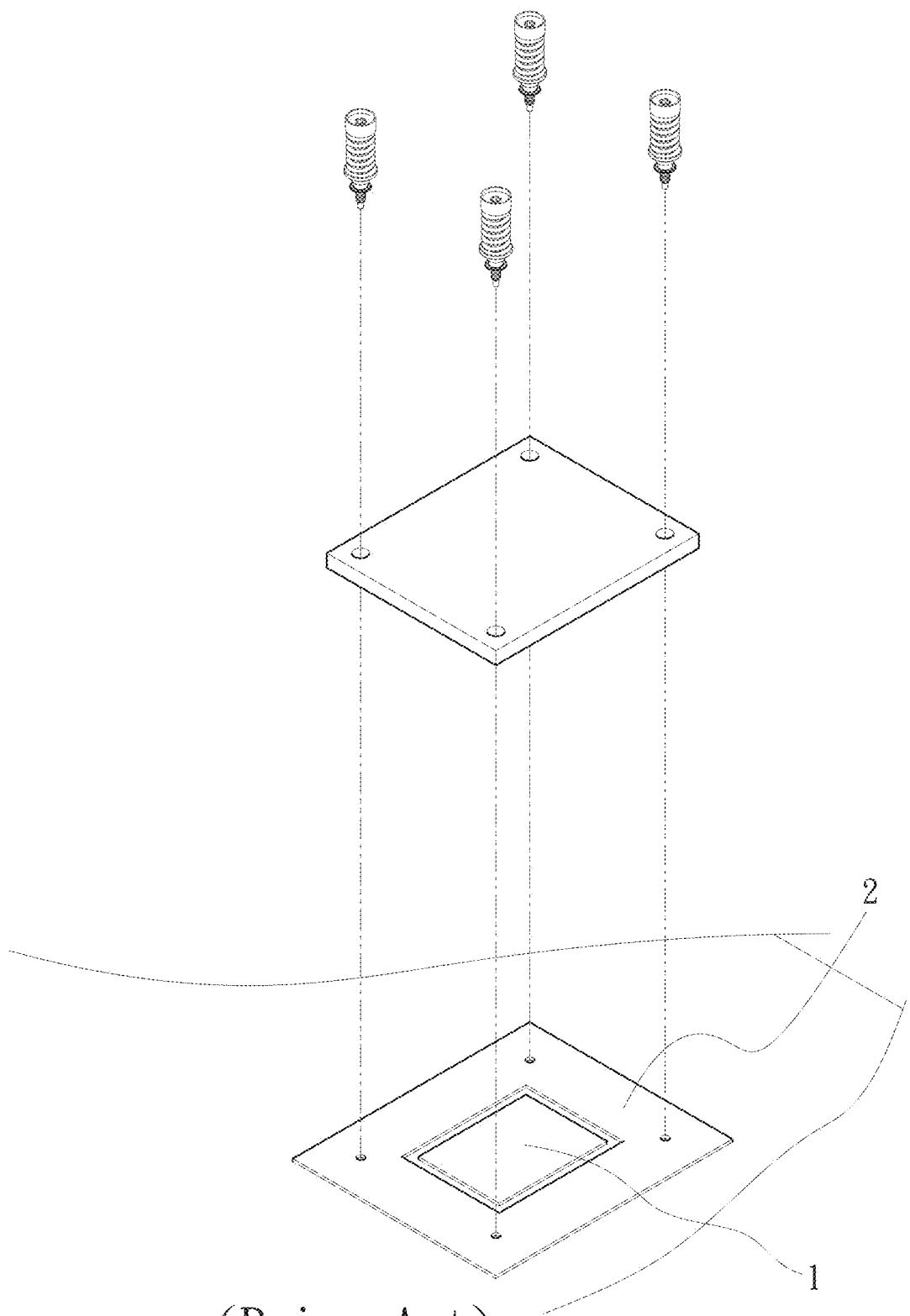
FIG. 1a is an exploded perspective view showing the connection of a conventional thermal module to a heat source.
Figure 1B:
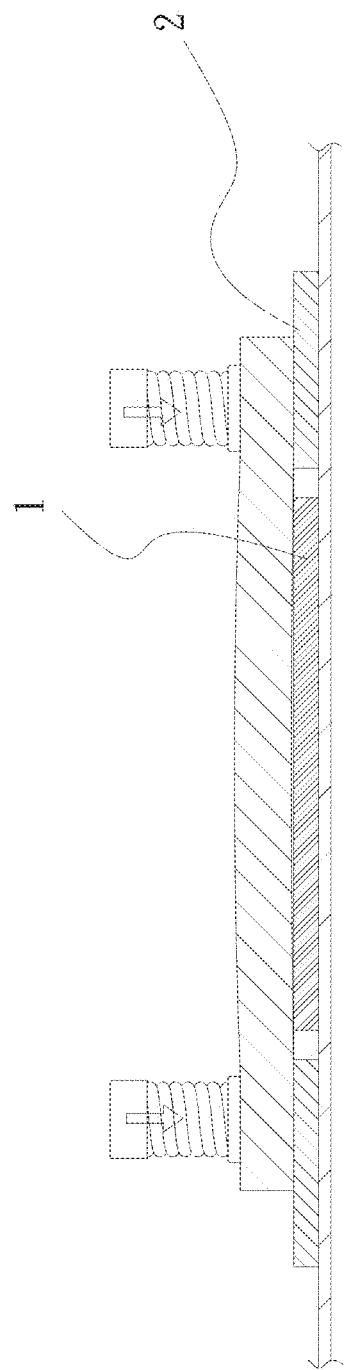
Figure 2:
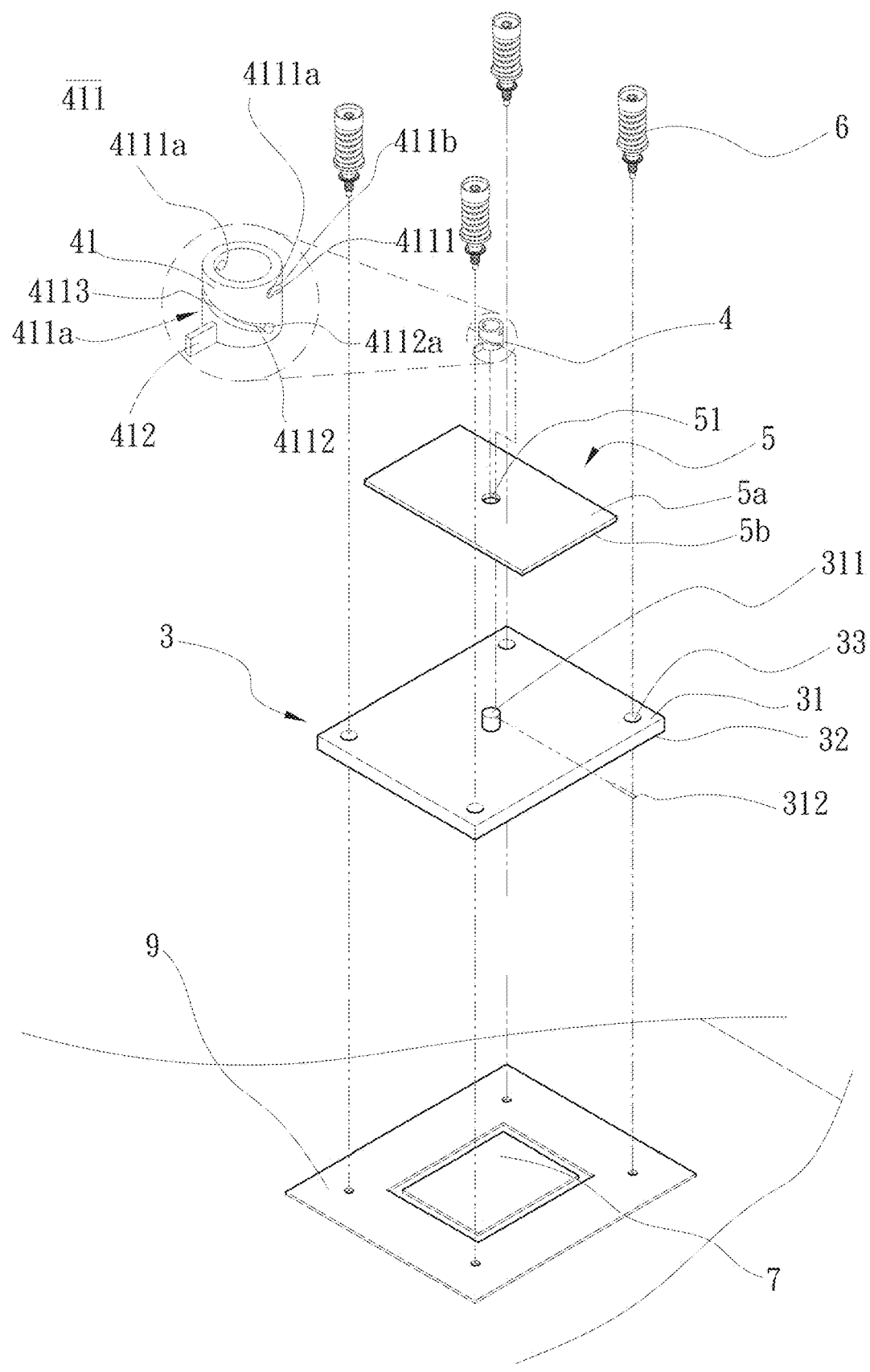
FIG. 2 is an exploded perspective view of a structure for evenly applying forces on a heat dissipation base according to an embodiment of the present invention.
Figure 3A:
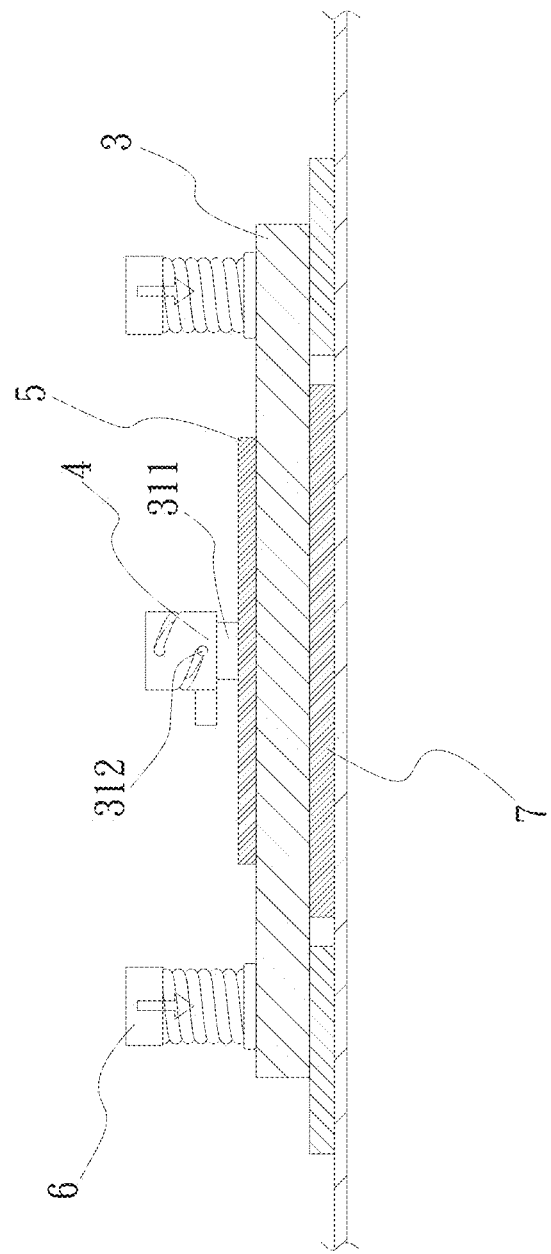
FIG. 3a is an assembled sectional view of FIG. 2.
Figure 3B:
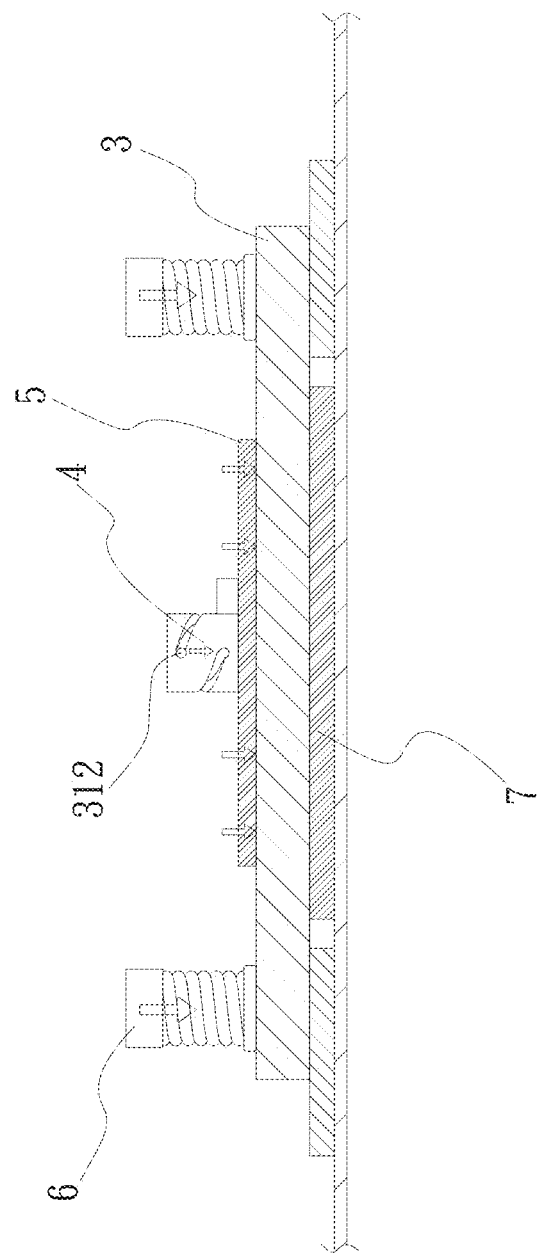
FIG. 3b is another assembled sectional view of FIG. 2.

Please refer to FIG. 2, which is an exploded perspective view of a structure for evenly applying forces on a heat dissipation base according to an embodiment of the present invention; and to FIGS. 3a and 3b, which are assembled sectional views of FIG. 2. For the purpose of conciseness and clarity, the structure for evenly applying forces on a heat dissipation base plate of the present invention is also briefly referred to as "the structure" herein. As shown, the structure includes a heat dissipation base 3, an adjustment element 4, and a hold-down member 5.

The heat dissipation base 3 has an upper surface 31 and a lower surface 32, and includes at least one through bore 33 formed at each of four corners of the heat dissipation base 3; a screw fastening element 6 extended through each of the through bores 33 to fix the heat dissipation base 3 to a top of a heat source 7 with the lower surface 32 of the heat dissipation base 3 being in contact with the heat source 7; a boss 311 upward protruded from the upper surface 31; and a shaft 312. The shaft 312 is extended in a radial direction through the boss 311 with two ends of the shaft 312 projected from an outer surface of the boss 311.

The heat dissipation base 3 is screw-fastened to a corresponding fixing seat, a circuit substrate, or a heat transfer element.

The shaft 312 may be otherwise replaced with a pair of sideward protruded pins, which are integrally formed with the boss 311 to project from two diametrically opposite points on an outer surface of the boss 311 in perpendicular to the boss 311.

The hold-down member 5 has an upper side 5a, a lower side 5b and a through-opening 51, and is disposed on a central area of the upper surface 31 of the heat dissipation base 3. The through-opening 51 is extended from the upper side 5a to the lower side 5b of the hold-down member 5. When the through-opening 51 is correspondingly fitted around the outer surface of the boss 311, the hold-down member 5 is assembled to the heat dissipation base 3. The hold-down member 5 can be a plate, a sheet, a strip or a frame in a rectangular shape, a cross shape, a letter-X shape, a star shape, a letter-n shape, or a hollow square shape.

The adjustment element 4 includes a hollow cylindrical body 41 with two open ends for externally fitting around the boss 311. The hollow cylindrical body 41 is formed on a peripheral wall with a sliding slot section 411 and a force applying section 412. The force applying section 412 can be in the form of a push plate or a bar. The shaft 312 is engaged with and slidable in along the sliding slot section 411. The sliding slot section 411 includes a first spiral slot 411a and a second spiral slot 411b. The first and the second spiral slot 411a, 411b respectively include a first end 4111, a second end 4112, and a spiral slot portion 4113. The first end 4111 is the highest point of the first and of the second spiral slot 411a, 411b; and the second end 4112 is the lowest point of the first and of the second spiral slot 411a, 411b. The first and the second end 4111, 4112 are located at two ends of each of the spiral slot portions 1143, and communicable with each other via the spiral slot portion 1143. A first locating point 4111a is provided at an outmost point of the first end 4111 and a second locating point 4112a is provided at an outmost point of the second end 4112. The first and the second spiral slot 411a, 411b are spaced from each other by 180 degrees. The first ends 4111 are top dead centers of the sliding slot section 411 and located near the upper open end of the hollow cylindrical body 41; and the second ends 4112 are bottom dead centers of the sliding slot section 411 and located near the lower open end of the hollow cylindrical body 41. When the force applying section 412 of the adjustment element 4 is operated to drive the hollow cylindrical body 41 to rotate, the shaft 312 is caused to slide in along the sliding slot section 411. When the shaft 312 slides from the second ends 4112 (i.e. the bottom dead centers) of the sliding slot section 411 to the first ends 4111 (i.e. the top dead centers) of the sliding slot section 411, the hollow cylindrical body 41 is brought to move downward in an axial direction of the boss 311, such that a lower end of the adjustment element 4 is pressed against the hold-down member 5, forcing the hold-down member 5 to apply evenly distributed downward forces on a central area of the heat dissipation base 3. Further, by properly operating the adjustment element 4, the forces applied by the hold-down member 5 on the heat dissipation base 3 can be finely adjusted to prevent the heat source 7 (in the form of a bare die) from breaking due to excessive downward forces applied thereto in one time. Meanwhile, with the hold-down member 5, it is also possible to increase the overall downward pressure applied by the heat dissipation base 3 to the heat source 7.

The heat dissipation base 3 and the heat source 7 may otherwise have a receiving space existing between them for receiving at least one heat transfer element therein. The heat transfer element is superposed on the heat source 7. The hold-down member 5 can apply evenly distributed downward forces on the heat dissipation base 3 for the heat transfer element to more tightly contact with the heat source 7. The heat transfer element can be a heat pipe or a vapor chamber. In the illustrated embodiment, the heat transfer element may be a heat pipe. However, it is understood the present invention is not particularly limited thereto.

Figure 4:
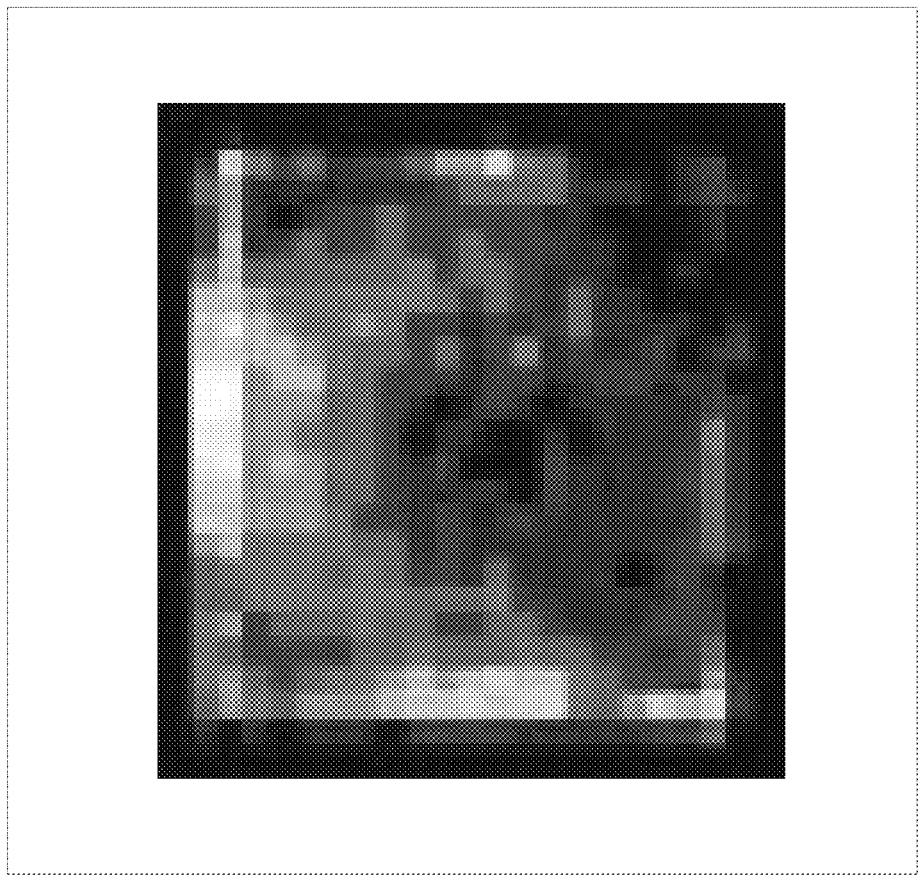
FIG. 4 is a thermogram of the structure for evenly applying forces on a heat dissipation base according to the present invention.

FIG. 4 is a three-dimensional thermogram of the heat dissipation base 3 in the present invention. Please refer to FIG. 4 along with FIGS. 2, 3a and 3b. When the screw fastening elements 6 are quickly extended through the through bores 33 at the four corners of the heat dissipation base 3, the latter is fixedly fastened at four corners to a fixing seat 9, and there is not any image in the thermogram of FIG. 4 showing it is affected by heat. Then, turn the adjustment element 4 for the hollow cylindrical body 41 to downward press against the hold-down member 5. The sliding slot section 411 on the hollow cylindrical body 41 and the shaft 312 are slidable relative to each other. When operating at the force applying section 412 of the adjustment element 4, the hollow cylindrical body 41 is driven to rotate. At this point, the sliding slot section 411 is guided by the shaft 312 to move the whole hollow cylindrical body 41 downward in an axial direction to apply a downward force on the hold-down member 5, such that the hold-down member 5 further applies evenly distributed downward forces on the central area of the heat dissipation base 3. In this manner, the heat dissipation base 3 and the heat source 7 can be in tight contact with one another without leaving any clearance between them to thereby enable upgraded heat transfer performance. Further, the adjustment element 4 can be slowly adjusted to avoid the heat source 7 (i.e. the bare die) from being damaged by excessive pressure suddenly applied by the heat dissipation base 3 on the heat source 7.

Under this condition, the thermogram of FIG. 4 shows that a generally uniform color is distributed over all locations, which means the heat source 7 is under evenly distributed forces from the heat dissipation base plate 3 and accordingly, heat from the heat source 7 is also evenly distributed in the thermogram.

The present invention is characterized in providing a structure for evenly applying forces on a heat dissipation base 3 for the latter to fully tightly press against a heat source 7, so that heat can be evenly transferred from the heat source 7 to the heat dissipation base 3 while effectively overcome the problem of thermal resistance that would occur if the heat source 7 and the heat dissipation base 3 are not in full contact with one another.

The present invention has been described with a preferred embodiment thereof and it is understood that many changes and modifications in the described embodiment can be carried out without departing from the scope and the spirit of the invention that is intended to be limited only by the appended claims.

What is claimed is:

1. A structure for evenly applying forces on a heat dissipation base, comprising:
    a heat dissipation base having an upper surface and a lower surface, and including at least one through bores formed at each of four corners of the heat dissipation base; a screw fastening element extended through each of the through bores to fix the heat dissipation base to a top of a heat source with the lower surface of the heat dissipation base being in contact with the heat source; a boss upward protruded from the upper surface; and a shaft extended in a radial direction through the boss with two ends of the shaft projected from an outer surface of the boss;
    a hold-down member having an upper side and a lower side and being formed with a through-opening that extends from the upper side to the lower side; and the hold-down member being disposed on the upper surface of the heat dissipation base with the through-opening correspondingly fitted around the outer surface of the boss; and
    an adjustment element including a hollow cylindrical body with two open ends for externally fitting around the boss; the hollow cylindrical body being provided on a peripheral wall with a sliding slot section and a force applying section; the shaft of the heat dissipation base being engaged with and slidable in along the sliding slot section; the force applying section being operable to drive the hollow cylindrical body to rotate while causing the shaft of the heat dissipation base to slide in along the sliding slot section, such that the hollow cylindrical body is brought to move downward in an axial direction of the boss, enabling the adjustment element to force the hold-down member to apply evenly distributed downward forces on a center area of the heat dissipation base.

2. The structure for evenly applying forces on a heat dissipation base as claimed in claim 1, wherein the hold-down member is disposed on a central area of the upper surface of the heat dissipation base.

3. The structure for evenly applying forces on a heat dissipation base as claimed in claim 1, wherein the sliding slot section includes a first spiral slot and a second spiral slot; the first and the second spiral slot being formed in correspondence to each other and respectively including a first end, a second end, and a spiral slot portion; the two first ends being the highest points of the first and second spiral slots, and the two second ends being the lowest points of the first and second spiral slots; in each of the first and the second spiral slots, the first and the second end being located at two ends of the spiral slot portion and being communicable with each other via the spiral slot portion; each of the first ends having a first locating point provided at an outmost point thereof, and each of the second ends having a second locating point provided at an outmost point thereof; and the first and the second spiral slot being spaced from each other by 180 degrees.

\* \* \* \* \*